US007646098B2

(12) United States Patent
Japp et al.

(10) Patent No.: US 7,646,098 B2
(45) Date of Patent: Jan. 12, 2010

(54) MULTILAYERED CIRCUITIZED SUBSTRATE WITH P-ARAMID DIELECTRIC LAYERS AND METHOD OF MAKING SAME

(75) Inventors: Robert M. Japp, Vestal, NY (US); Voya R. Markovich, Endwell, NY (US); Kostas I. Papathomas, Endicott, NY (US); Mark D. Poliks, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 12/081,042

(22) Filed: Apr. 10, 2008

(65) Prior Publication Data

US 2008/0191353 A1 Aug. 14, 2008

Related U.S. Application Data

(63) Continuation-in-part of application No. 11/086,323, filed on Mar. 23, 2005, now Pat. No. 7,470,990.

(51) Int. Cl.
*H01L 23/485* (2006.01)
(52) U.S. Cl. .............. 257/759; 257/758; 257/760; 257/E23.019; 438/118; 438/622; 438/623
(58) Field of Classification Search ................ 257/703, 257/758–762; 174/255, 256; 438/118, 522–524
See application file for complete search history.

(56) References Cited

U.S. PATENT DOCUMENTS

| | | | |
|---|---|---|---|
| 3,767,756 A | 10/1973 | Blades | |
| 3,869,429 A | 3/1975 | Blades | |
| 3,869,430 A | 3/1975 | Blades | |
| 3,953,566 A | 4/1976 | Gore | |
| 4,729,921 A | 3/1988 | Tokarsky | |
| 5,229,199 A | 7/1993 | Miner et al. | |
| 5,246,817 A | 9/1993 | Shipley, Jr. | |
| 5,314,742 A | 5/1994 | Kirayoglu et al. | |
| 5,418,689 A | 5/1995 | Alpaugh et al. | |
| 5,652,055 A | 7/1997 | King et al. | |
| 6,207,595 B1 | 3/2001 | Appelt et al. | |
| 6,323,436 B1 * | 11/2001 | Hedrick et al. | 174/256 |
| 6,358,608 B1 | 3/2002 | Hanyon et al. | |
| 6,495,244 B1 * | 12/2002 | Andresakis et al. | 428/209 |
| 6,534,179 B2 * | 3/2003 | Japp et al. | 428/413 |
| 6,890,635 B2 * | 5/2005 | Lin et al. | 428/295.1 |
| 6,900,269 B2 * | 5/2005 | Hwang et al. | 525/109 |
| 7,078,816 B2 | 7/2006 | Japp et al. | |
| 7,145,221 B2 | 12/2006 | Memis et al. | |
| 7,270,845 B2 | 9/2007 | Japp et al. | |

* cited by examiner

*Primary Examiner*—Thinh T Nguyen
(74) *Attorney, Agent, or Firm*—Hinman, Howard & Kattell; Mark Levy

(57) ABSTRACT

A multilayered circuitized substrate including a plurality of dielectric layers each comprised of a p-aramid paper impregnated with a halogen-free, low moisture absorptivity resin including an inorganic filler but not including continuous or semi-continuous fiberglass fibers as part thereof, and a first circuitized layer positioned on a first of the dielectric layers. A method of making this substrate is also provided.

13 Claims, 3 Drawing Sheets

MULTILAYERED CIRCUITIZED SUBSTRATE WITH P-ARAMID DIELECTRIC LAYERS AND METHOD OF MAKING SAME

CROSS REFERENCE TO CO-PENDING APPLICATIONS

In Ser. No. 11/896,786, filed Sep. 6, 2007, there is defined a circuitized substrate which includes at least one circuit layer and at least one substantially solid dielectric layer comprised of a dielectric composition which includes a cured resin material and a predetermined percentage by weight of particulate fillers, but not including continuous or semi-continuous fibers as part thereof. Ser. No. 11/896,786 is a divisional application of Ser. No. 10/812,889, which is now U.S. Pat. No. 7,078,816 (see below).

In Ser. No. 11/086,323, filed Mar. 23, 2005, there is defined a circuitized substrate including a composite layer having a first dielectric sub-layer including a plurality of fibers having a low coefficient of thermal expansion and a second dielectric sub-layer of a low moisture absorptivity resin, the second dielectric sub-layer not including continuous or semi-continuous fibers or the like as part thereof. The substrate further includes at least one electrically conductive layer as part thereof.

In Ser. No. 12/081,051, filed concurrently herewith, there is defined a circuitized substrate including a dielectric layer having a p-aramid paper impregnated with a halogen-free, low moisture absorptivity resin and not including continuous or semi-continuous fiberglass fibers as part thereof, and a first circuitized layer positioned on the dielectric layer. A method of making this substrate is also provided. This composition is similar to those used usable in the present invention.

The present invention is a continuation-in-part application of Ser. No. 11/086,323 filed on Mar. 23, 2005, now U.S. Pat. No. 7,470,990. All of the above applications are assigned to the same Assignee as the present invention.

TECHNICAL FIELD

This invention relates to multilayered circuitized substrates such as printed circuit boards (hereinafter also referred to simply as PCBs) and chip carriers and to processes for manufacturing same. Even more particularly, it relates to such substrates which are thin and yet which possess low flammability ratings.

BACKGROUND OF THE INVENTION

Multilayered circuitized substrates such as PCBs, laminate chip carriers, and the like permit formation of multiple circuits in a minimum volume or space. Such structures typically comprise a stack of layers of signal, ground and/or power planes (lines) separated from each other by a layer of dielectric material. The lines on one plane are often in electrical contact with those on another plane by plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness.

Known manufacturing methods of making multilayered circuitized substrates typically comprise fabrication of separate inner-layer circuits (circuitized layers), which are formed by coating a photosensitive layer or film over a copper layer of a copper clad inner-layer base dielectric material. The photosensitive coating is imaged, developed and the exposed copper is etched to form the desired number of conductor lines or other features such as power and ground planes patterns. The photosensitive film is then stripped from the copper, leaving the circuit pattern on the surface of the inner-layer base dielectric material. Often, this methodology is referred to as photolithographic processing in the PCB art. Added description is not believed necessary in view of such known teachings.

A multilayered stack of these formed structures may now be produced by preparing a lay-up of inner-layers, ground planes, power planes, etc., typically separated from each other by a layer of conventional dielectric "pre-preg" material, which usually includes a layer of glass cloth (fiberglass) impregnated with a partially cured material (e.g., a "B-stage" epoxy resin). The outermost (top and bottom) layers of the multilayered stack usually comprise copper clad, glass-filled, epoxy planar substrates with the copper cladding comprising the exterior surfaces of the stack. This stack is laminated to form a monolithic structure using heat and pressure to fully cure the B-stage resin. As understood, the resulting stack typically has metal (usually copper) cladding on both of its exterior surfaces. Exterior circuit layers are formed in the copper cladding often using photolithographic processing methodology similar to the procedures used to form the inner-layer circuits. As explained above, a photosensitive film is applied to the copper cladding, exposed to patterned activating radiation, and developed. An etchant such as cupric chloride may then be used to remove copper bared by the development of the photosensitive film. Finally, the remaining photosensitive film is removed to provide the exterior circuit layers. Various elements of these outer layers, such as pads, may then be electrically coupled to selected electronic components eventually mounted on the structure, such components including capacitors, resistors, modules, and the like, including even semiconductor chips.

To electrically connect individual circuit layers within the structure, thru-holes (or "interconnects") are used, these thru-holes passing through all or a portion of the "stack". Thru-holes are generally formed prior to the formation of circuits on the exterior surfaces by drilling holes through the stack at appropriate locations. Following several pre-treatment steps, the walls of the holes are typically catalyzed by contact with a plating catalyst and metallized, typically by contact with an electro-less or electrolytic copper plating solution to form conductive pathways between circuit layers. Following formation of the thru-holes, exterior circuits, or outer conductive layers are formed using the above procedure(s).

Following formation of the multilayered substrate, the aforementioned semiconductor chips and/or other electrical components (e.g., resistors, capacitors, and even including chip carriers in the case of multilayered PCBs) are mounted at appropriate locations on the exterior circuit layers of the multilayered structure, typically using solder mount pads to bond the components. These components are usually in electrical contact with the circuits within the structure through the thru-holes, as desired. Such solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and then exposed and developed to yield an array of openings defining the pads. The openings are then coated with solder, e.g., using wave soldering or a like process known in the art.

Today's growing demands for products possessing greater processing capabilities has in turn resulted in the need to provide more complex substrates. That is, the relative complexity of various circuitized substrate product designs has increased significantly in recent years. Mainframe computer PCBs, for example, may require as many as thirty-six layers of circuitry or more, with the complete structure having a thickness of as much as about 0.250 inch (250 mils). Chip carriers, designed to carry one or more semiconductor chips thereon, also require more conductive layers and more complex circuit designs. These products have been typically designed with about three or five mil wide signal lines and twelve mil diameter thru-holes. For increased circuit densification in many of today's products, however, the industry desires to reduce signal line widths and thru-hole diameters to two mils or less. The substrate industry also desires to avoid manufacturing problems frequently associated with such more complex products, as is understandable. For example, many current processes utilize inner-layer materials that are glass-reinforced resin or other suitable dielectric material, clad with metal (typically copper) on both surfaces.

The desired strength and rigidity of the resulting multilayered circuitized substrate is made possible in many known products using fiberglass-reinforcing material (as mentioned above), which in turn typically utilizes continuous or semi-continuous strands of fiberglass which extend throughout the width and length of the overall final substrate. If continuous, these fiberglass strands commonly run the full width (or length) of the structure and include no breaks or other segments as part thereof. Thus, by the term "continuous" as used herein to define fibrous materials is meant a structure such as a woven cloth of lengthy fibers, including fibers which, as stated, typically run the full distance through the structure. By the term "semi-continuous" is meant structures with much shortened length fibers, which are also referred to as "chopped" fibers, such as chopped fiber mats. Such fibrous materials occupy a relatively significant portion of the substrate's total volume, a disadvantage especially when attempting to produce highly dense numbers of thru-holes and very fine line circuitry to meet new, more stringent design requirements. More specifically, when holes are drilled (typically using laser or mechanical drills) to form these needed thru-holes, end segments of the fiberglass fibers may extend into the holes during lamination, and, if so, must be removed prior to metallization. This removal, in turn, creates the need for additional pretreatment steps such as the use of glass etchants to remove the glass fibrils extending into the holes, subsequent rinsing, etc. If the glass is not removed, a loss of continuity might occur in the thru-hole internal wall metal deposit. In addition, both continuous and semi-continuous glass fibers add weight and thickness to the overall final structure, yet another disadvantage associated with such fibers. Additionally, since lamination is typically at a temperature above 150° C., the resinous portion of the laminate usually shrinks during cooling to the extent permitted by the rigid copper cladding, which is not the case for the continuous strands of fiberglass or other continuous reinforcing material used. The strands thus take on a larger portion of the substrate's volume following such shrinkage and add further to complexity of manufacture in a high density product. If the copper is etched to form a discontinuous pattern, laminate shrinkage may not be restrained even to the extent above by the copper cladding. Obviously, this problem is exacerbated as feature sizes (line widths and thicknesses, and thru-hole diameters) decrease. Consequently, even further shrinkage may occur. The shrinkage, possibly in part due to the presence of the relatively large volume percentage of continuous or semi-continuous fiberglass strands in the individual layers used to form a final product possessing many such layers, may have an adverse affect on dimensional stability and registration between said layers, adding even more problems for the PCB manufacturer.

The presence of fiberglass within the multilayered structure, especially woven fiberglass, also substantially impairs the ability to form high quality, very small thru-holes using laser drilling (ablation), one of the most preferred means to form such thru-holes. Fiberglass cloth has drastically different absorption and heat of ablation properties than typical thermo-set or thermo-plastic matrix resins. In a typical woven glass cloth, for example, the density of glass a laser might encounter can vary from approximately zero percent in a window area to approximately fifty percent by volume or even more, especially in an area over a cloth "knuckle". This wide variation in encountered glass density leads to problems obtaining the proper laser power for each thru-hole and may result in wide variations in thru-hole quality, obviously unacceptable by today's very demanding manufacturing standards. Fiberglass presence also often contributes to an electrical failure mode known as CAF growth. CAF (cathodic/anodic filament) growth often results in time dependent electrical shorting failure which occurs when dendritic metal filaments grow along an interface (typically a glass fiber/epoxy resin interface), creating an electrical path between two features which should remain electrically isolated. Whether continuous (like woven cloth) or semi-continuous (like chopped fiber mattes), fiberglass strand lengths are substantial in comparison to the common distances between isolated internal features, and thus these fibers can be a significant detractor for PCB insulation resistance reliability. While the use of glass mattes composed of random discontinuous chopped fibers (in comparison to the longer fibers found in continuous structures) can largely abate the problem of inadequate laser drilled thru-hole quality, such mattes still contain fibers with substantial length compared to internal board feature spacing and, in some cases, offer virtually no relief from the problem of this highly undesirable type of growth.

Many of today's semiconductor packaging substrates are composed of a inner woven fiberglass cloth construction ranging from about 400 to 800 microns thick and include "build-up" layers atop one or both sides thereof in order to form more dense structures. The resulting structure, being so thick, must then be drilled using mechanical drilling, resulting in the pitch (hole-to-hole spacing) dimensions being large. This of course defeats miniaturization objectives.

The use of alternative dielectric materials have been proposed to address the fiberglass strand problems, including, for example, one known as "expanded PTFE", PTFE being the designate for polytetrafluoroethylene. A common example of such material is the well known material Teflon, sold by E. I. DuPont de Nemours and Company. In U.S. Pat. No. 5,652,055, for example, there is described an adhesive sheet (or "bond ply") material suitable to serve as adhesive layers in a variety of adhesive applications, such as in circuit board laminates, multi-chip modules, and in other electrical applications. The adhesive sheet is described as being constructed from an expanded PTFE material, such as that described in U.S. Pat. No. 3,953,566. Preferably, the material is filled with inorganic filler and is constructed as follows: a ceramic filler is incorporated into an aqueous dispersion of dispersion-produced PTFE. The filler in small particle form is ordinarily less than forty microns in size, and preferably less than fifteen microns. The filler is introduced prior to co-coagulation in an amount that will provide ten to sixty percent, and preferably forty to fifty percent by weight filler in the PTFE, in relation to the final resin-impregnated composite. The filled PTFE dispersion is then co-coagulated, usually by rapid stirring. The coagulated filled PTFE is then added. The filled material is then lubricated with a common paste extrusion lubricant, such as mineral spirits or glycols, and then paste extruded. The extrudate is usually calendared, and then rapidly stretched 1.2 to 5000 times, preferably two times to 100 times, per this patent, at a stretch rate of over ten percent per second, at a temperature of between 35 degrees C. and 327 degrees C. The lubricant can be removed from the extrudate prior to stretching, if desired. The resulting expanded, porous filled PTFE is then imbibed with adhesive by dipping, calendaring, or using a doctor blade on a varnish solution of about two to seventy percent adhesive in solvent. The wet composite is then affixed to a tenter frame, and subsequently "B-staged" at or about 165 degrees C. for one to three minutes. The resulting sheet adhesive typically consists of: (a) 9 to 65 weight percent PTFE; (b) 9 to 60 weight percent inorganic filler, in the form of particulate; and (c) 5 to 60 weight percent adhesive imbibed within the porous web structure.

The coefficients of thermal expansion (CTE) of the semiconductor chip, the organic chip carrier, and the printed circuit board are of particular concern when these components are mounted as closely together as is known in the industry. If these CTEs are substantially different from one another, industry standard semiconductor chip array interconnections to the organic chip carrier may be subject to high stress during thermal cycling operation, thus presenting another possible problem to the manufacturer of such substrates. If solder ball connections (e.g., a ball grid array (BGA)) are used, as is well known, the formed solder interconnections between the organic chip carrier and printed circuit board may also be subject to high stress during operation. Significant reliability concerns may then become manifest by failure of the connections or even failure of the integrity of the semiconductor chip (also known as chip "cracking"). These reliability concerns significantly inhibit design flexibility. For example, semiconductor chip sizes may be limited, or interconnect sizes, shapes and spacing may have to be customized beyond industry standards to reduce these stresses. These limitations may limit the electrical performance advantages of the organic electronic package or add significant cost to the carrier-chip (s) electronic package. Typically, a semiconductor chip has a CTE of two-three parts per million per degree Celsius (ppm/.degree. C.) while a standard printed circuit board has a much greater CTE of 17-20 ppm/degree. C.

Reliability is another concern with circuitized substrate products, especially chip carriers, because of the presence of a "surface redistribution layer" which interfaces between the organic substrate and the semiconductor chip. This layer may be susceptible to stresses resulting from thermal cycling of the organic substrate together with a chip which is also solder coupled with the organic substrate. Such stresses result from a CTE differential between the surface redistribution layer and the remainder of the organic substrate. The ability of the surface redistribution layer to withstand such stresses depends on mechanical properties of the surface redistribution layer. If the redistribution layer cannot accommodate the thermal stresses, then the surface redistribution layer is also susceptible to deterioration, such as cracking, which can cause failure of interconnections between the carrier and chip, as well as between the carrier and PCB.

One of the most significant properties of concern to circuitized substrate product manufacturers is flammability. This safety concern means the ability of the final product to become inflamed or burn, e.g., due to the presence of excessive heat and/or when operating under extremely high electrical loads. Understandably, potentially serious damages may arise should a circuitized substrate become inflamed or burn during operation. Such flammability concerns have long been recognized in the industry, which has in turn resulted in many dielectric materials possessing a flame retardant ("FR") rating, e.g., "FR4." In the case of multilayered substrates such as PCB's, this flammability rating is primarily determined by the thickness of the substrate's "core" structure, with the additional "build-up" layers then including flame retardant compositions. More specifically, some manufacturers have added halogen-containing additives such as bromine to the dielectric compositions of the "build-up" layers. Halogens such as bromine containing additives are known for retarding flame production under high heat conditions. However, there are environmental concerns with respect to such usage. Existing and/or proposed legislation in Europe and Japan, for example, now prohibit such materials.

The following listing of patents includes those which describe various dielectric compositions and substrates including same, in addition to methods of making such substrates. The listing is not intended to represent that an exhaustive search of the art has been conducted nor is providing the listing an admission that any are prior art to the presently claimed invention.

In U.S. Pat. No. 7,270,845, there is defined a dielectric composition which forms a dielectric layer usable in circuitized substrates such as PCBs, chip carriers and the like. As such a layer, it includes a cured resin material and a predetermined percentage by weight of particulate fillers, thus not including continuous fibers, semi-continuous fibers or the like as part thereof. U.S. Pat. No. 7,270,845 is assigned to the same Assignee as the present invention.

In U.S. Pat. No. 7,145,221, there is defined a circuitized substrate comprising a first layer comprised of a dielectric material including a low moisture absorptive polymer resin in combination with a nodular fluoropolymer web encased within the resin, the resulting dielectric layer formed from this combination not including continuous or semi-continuous fibers as part thereof. The substrate further includes at least one circuitized layer positioned on the dielectric first layer. An electrical assembly and a method of making the substrate are also provided, as is an information handling system (e.g., computer) incorporating the circuitized substrate of the invention as part thereof. U.S. Pat. No. 7,145,221 is assigned to the same Assignee as the present invention.

In U.S. Pat. No. 7,078,816, there is defined a circuitized substrate comprising a first layer comprised of a dielectric material including a resin material including a predetermined quantity of particles therein and not including continuous fibers, semi-continuous fibers or the like as part thereof, and at least one circuitized layer positioned on the dielectric first layer. An electrical assembly and a method of making the substrate is also provided, as is a circuitized structure including the circuitized substrate in combination with other circuitized substrates having lesser dense thru-hole patterns. An information handling system incorporating the circuitized substrate of the invention as part thereof is also provided. U.S. Pat. No. 7,078,816 is assigned to the same Assignee as the present invention.

In U.S. Pat. No. 6,358,608, there are described various fire retardant and heat resistant yarns, fabrics, felts and other fibrous blends which incorporate high amounts of oxidized polyacrylonitrile fibers. Such yarns, fabrics, felts and other fibrous blends have a superior Limiting Oxygen Index (LOI) and Thermal Protective Performance (TPP) compared to some other fire retardant fabrics. The yarns, fabrics, felts and other fibrous blends is this patent are also described as being more soft and supple, and therefore more comfortable to wear, compared to conventional fire retardant fabrics. The yarns, fabrics, felts and other fibrous blends incorporate up to 99.9% oxidized polyacrylonitrile fibers, together with at least one additional fiber, such as p-aramid, in order to provide increased tensile strength and abrasion.

In U.S. Pat. No. 6,323,436, PCBs are prepared by first impregnating a non-woven aramid chopped fiber mat or a thermoplastic liquid crystalline polymer (LCP) paper instead of the reinforcement typically used in the electronics industry, described in this patent as a woven glass fabric. This aramid reinforcement matte is comprised of a random (in-plane) oriented mat of p-aramid (poly (p-phenylene terephthalamide)) fibers comprised of Kevlar (Kevlar is a registered trademark of E. I. duPont deNemours and Company), and has a dielectric constant of four, as compared to 6.1 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about −3 to about −6 ppm/degree Celsius (hereinafter C.) when combined with a thermosetting resin, the final composite described in this patent is said to possess a CTE which can be controlled and adjusted to match that of silicon or semiconductor chips in the range of about 3 to about 10 ppm/degree C. The thermoplastic liquid crystal polymer (LCP) paper is a material called Vecrus (Vecrus is a registered trademark of Hoechst Celanese Corp.), which uses the company's Vectra polymer as part thereof (Vectra also being a registered trademark of Hoechst Celanese Corp.). According to this patent, the paper has a dielectric constant of 3.25, a dissipation factor of 0.024 at sixty Hertz (Hz), a UL 94-V0 rating and an in-plane CTE of less than 10 ppm/degree. C. The alleged advantages of this material over the aramid mat are the lower dielectric constant and very low moisture absorption, allegedly less than 0.02%. The non-woven aramid or LCP paper is used in conjunction with a thermosetting resin to form the final composite substrate. Examples of thermosetting resins useful in this patent include epoxy, cyanate ester, bismaleimide, bismaleimide-triazine, maleimide or combinations thereof. The resin-impregnated low CTE reinforcement is then partially cured to a "B"-stage to form the pre-preg, and then the pre-preg is cut, stacked, and laminated to form a sub-composite with exterior copper sheets.

In U.S. Pat. No. 6,207,595, there is described an example of a dielectric material composition for use in a PCB in which the dielectric layer's fabric material is made from a cloth member having a low enough content of particulates and a sufficient quantity of resin material to completely encase the cloth member including the particulates, so that the resin material extends beyond the highest protrusions of the cloth member (i.e. the fabric material is thicker and will pass a certain test standard (in '595, the known HAST level A test). Thus, the woven cloth is known to include a quantity of particulates, which term is meant in '595 to include dried film, excess coupler, broken filaments, and gross surface debris. The resin may be an epoxy resin such as one often used for "FR4" composites ("FR4" has become a conventional, abbreviated name for the resulting substrates and often also for the resins forming part thereof, and is based in part on the flame retardant (hence the "FR" designation) rating of these established products).

In U.S. Pat. No. 5,418,689, there is described a PCB product wherein the dielectric substrate can include a thermoplastic and/or thermosetting resin. Thermosetting polymeric materials mentioned in this patent include epoxy, phenolic base materials, polyimides and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers.

In U.S. Pat. No. 5,314,742, there is described the use of non-woven aramid sheets to provide reinforcement for the resulting laminate. The reinforcing aramid sheet is described as having a coefficient of thermal expansion (CTE) of less than 10 ppm per .degree. C. and is prepared from 75 to 95 wt. % p-aramid floc and from 5 to 25 wt. % poly(m-phenylene isophthalamide) fibrids. Floc is defined in U.S. Pat. No. 4,729,921. Para-aramid fibers are very high in strength and modulus. Examples of para-aramid fibers are set out in U.S. Pat. No. 3,869,429. Specific examples of para-aramid materials are poly(p-phenylene terephthalamide) (PPD-T) and copoly(p-phenylene-3,4'-oxydiphenylene terephthalamide). Fibers of PPD-T are generally made by an air gap spinning process such as described in U.S. Pat. No. 3,767,756, and are preferably heat treated as described in U.S. Pat. No. 3,869,430. Preferably, poly (p-phenylene terephthalamide) floc which has not been refined is utilized. High shear forces exerted on the fibers during processing, e.g., refining, may cause damage to the fibers and adversely affect the CTE of the reinforcement. It is also preferred to employ p-aramid floc of high orientation and relatively lower crystallinity. Fibrids are described in U.S. Pat. No. 4,729,921. To prepare the sheet, the floc and fibrids are dispersed in the desired proportions as an aqueous slurry, the solids concentration generally ranging between 0.005% and 0.02%. The slurry is not refined. The slurry can be made into paper by conventional means. In the examples mentioned in this patent, wet sheets were formed in an inclined wire Deltaformer papermaking machine and dried using heated drier cans. The dried sheets preferably had a basis weight between 0.8 and 4.0 oz/yd$^2$, and were then calendered between two hard-surface rolls. Calender pressures between about 500 and 2500 kg/cm (nip pressure) and roll temperatures between about 130 and 150 degrees C. were used. The paper was then pre-pregged with a resin having a high glass transition temperature (Tg), e.g., above about 160 degrees C.

In U.S. Pat. No. 5,246,817, there is described one form of improvement in the manufacture of products such as PCBs. The manufacturing process in U.S. Pat. No. 5,246,817 consists of the sequential formation of layers using photosensitive dielectric coatings and selective metal deposition procedures. Imaged openings may be formed by exposure of a photosensitive dielectric coating to activating radiation through a mask in an imaged pattern, followed by a described development procedure. Alternatively, imaging may be by laser ablation, in which case, the dielectric material need not be photosensitive.

In U.S. Pat. No. 5,229,199, there is described a rigid composite comprising a polyester, phenolic, or polyamide resin matrix reinforced with woven fabric of continuous p-aramid filaments coated with from about 0.2 to five percent, by weight, of a solid adhesion modifier which reduces the adhesion between said resin matrix and said p-aramid filaments embedded therein, the adhesion modifier selected from the group consisting of a 2-perfluoroalkylethyl ester, a paraffin wax and a combination thereof. The coated filaments, when embedded in the matrix and tested in accordance with MIL-STD-662D, exhibit a ballistics limit from about 1000 to 4000 feet per second and a composite areal density from about 0.4 to six pounds per square foot.

The present invention as defined herein represents an improvement over products and processes such as those described above by the utilization of, among other things, a plurality (e.g., two) of dielectric layers as part of a multilayered circuitized substrate in which the layers are each comprised of a p-aramid base paper impregnated with a low moisture absorption, halogen-free resin and an inorganic filler and which is designed for use in combination with at least one circuitized layer to form this multilayered substrate product. Significantly, the dielectric layers of this product do not include continuous or semi-continuous fiberglass fibers as part thereof. Still further, the product is relatively thin in construction and also possesses a low flammability rating. It is believed that such a product and method to make the product, as further defined herein, will represent significant advancements in the art.

OBJECTS AND SUMMARY OF THE INVENTION

It is a primary object of the invention to enhance the art of multilayered circuitized substrates.

It is another object of the invention to provide a multilayered circuitized substrate including two or more dielectric layers each of a new dielectric material possessing advantageous features such as reduced flammability, low moisture absorptivity and free of halogens.

It is another object to provide a method of making such a multilayered circuitized substrate which is adaptable to current manufacturing procedures, and which utilizes the new dielectric material defined herein.

According to one embodiment of the invention, there is provided a multilayered circuitized substrate comprising a thin core substrate including a first dielectric layer having a p-aramid paper impregnated with a composition including halogen-free, low moisture absorptivity resin including an inorganic particulate filler and not including continuous or semi-continuous fiberglass fibers as part thereof and a first circuitized layer positioned on this first dielectric layer, and a second dielectric layer bonded to the thin core substrate to form a multilayered circuitized substrate, this second dielectric layer being of a composition similar to the composition of the first dielectric layer.

According to another embodiment of the invention, there is provided a method of making a multilayered circuitized substrate, the method comprising providing a p-aramid paper, impregnating this p-aramid paper with a halogen-free, low moisture absorptivity resin including an inorganic filler to form a first dielectric layer not including continuous or semi-continuous fiberglass fibers as part thereof, forming a first circuitized layer on this first dielectric layer to form a thin core substrate, and bonding a second dielectric layer comprised of a composition similar to the composition of the first dielectric layer to the thin core substrate to form a multilayered circuitized substrate.

BEST MODE FOR CARRYING OUT THE INVENTION

Figure 1:
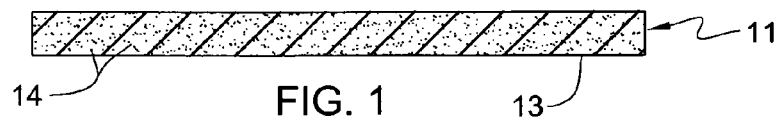
FIGS. 1-6 represent steps utilized to produce a multilayered circuitized substrate in accordance with one embodiment of the invention.

For a better understanding of the present invention, together with other and further objects, advantages and capabilities thereof, reference is made to the following disclosure and appended claims in connection with the above-described drawings. Like figure numbers will be used from figure to figure to identify like elements in these drawings.

By the term "circuitized substrate" as used herein is meant to include substrates having at least two (and preferably more) dielectric layer(s) of the new material defined herein and at least one (and preferably more) metal electrically conductive layer(s). It is believed that the teachings of the instant invention are also applicable to what are known as "flex" circuits.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface and/or to internal circuitry using one or more thru-holes. Perhaps the most well known such assembly is the conventional printed circuit board (PCB) typically having several such external electrical components thereon (including possibly one or more chip carriers) and coupled to the internal circuitry of the PCB and/or each other.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system which the substrate forms part of.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

By the term 'p-aramid" as used herein is meant a para-aromatic polyamide of which the polymeric main chain is composed wholly or for the most part of aromatic nuclei, such as phenylene, biphenylene, biphenyl ether, naphthylene, and the like, which are interconnected wholly or for the most part via the para-position (1,4-phenylene) or a comparable position (e.g., 2,6-naphthylene). Preferably, the aromatic nuclei are phenylene groups, more preferably, the polymer is PPTA. PPTA can be prepared in a known manner by the reaction in an appropriate solvent (notably CaCl.sub.2-containing N-methyl pyrrolidone) of stoichiometric amounts of paraphenylene diamine (PPD) and terephthalic acid dichloride (TDC).

By the term "thru-hole" as used herein is meant to include what are also commonly referred to in the industry as "blind vias" which are openings typically from one surface of a substrate to a predetermined distance therein, "internal vias" which are openings located internally of the substrate and are typically formed within one or more internal layers prior to lamination thereof to other layers to form the ultimate multilayered structure, and "plated through holes" (also known as PTHs), which are openings which typically extend through the entire thickness of a substrate. All of these various openings form electrical paths through the substrate and often include one or more conductive layers, e.g., plated copper, thereon. These openings are formed typically using mechanical drilling or laser ablation.

The present invention as understood from the teachings herein comprises a multilayered circuitized substrate which includes as part thereof a thin substrate core which is laser drillable, possesses a low CTE, is of dielectric material which is halogen-free, and which exhibits low dielectric constant, dissipation factor and moisture absorption. This unique combination is attainable at reasonable manufacturing costs, and is capable of being produced using conventional PCB processing equipment. The core is then combined with additional dielectric layers (at least one in the broader aspects of the invention) to provide the multilayered circuitized substrate adaptable for many uses, e.g., as a PCB and/or chip carrier in an information handling system.

To accomplish the above and other desirable features discernible from the teachings herein, the invention involves the utilization of two dielectric layers each comprised of a p-aramid base paper and a low-moisture absorption, halogen-free resin for a circuitized substrate product. Use of aramid fiber materials is known for such molded items as speaker cones and parts having good acoustical properties. Aramid fiber material for speaker cones generally combine crystallized p-aramid fibers and amorphous m-aramid fibrids, the fibrids acting as a binder for the p-aramid fibers by softening and bonding the fibers when the formed sheets are subjected to high pressure and temperature. Such aramid fiber papers typically have coloring similar to that of the base fiber. Generally, papers made from natural colored p-aramid fiber, such as the fiber known under the E. I. duPont deNemours and Company (duPont) trademark KEVLAR, range in color from golden to cream-beige. Papers made from natural colored m-aramid fiber, such as the fiber known under the duPont trademark NOMEX, range in color from off-white to light beige. The p-aramid fiber-containing KEVLAR is also known for its good fire retardant properties, as are other p-aramid materials. U.S. Pat. No. 6,358,608, cited above, represents use of p-aramid fibers for use in clothing which provides such properties. Use of p-aramid fibers is also known in the formation of impact-resistant clothing, e.g., for police officers, wherein the fibers are used in combination with a suitable resin. U.S. Pat. No. 5,229,199, mentioned above, is one example of this. Still, further, use of p-aramid fibers is known in other products such as asbestos replacement items (e.g. braking pads), hot air filtration fabrics, tires, ropes and cables, optical fiber cable systems, sail cloth, sporting goods, drumheads, wind instrument reeds, boat hull material, reinforced thermoplastic pipes and tennis strings.

A significant feature of the present invention, as mentioned above, is the utilization of a dielectric material as part of the multilayered substrate's two dielectric layers which enables the provision of high density arrays of thru-holes within the final substrate while substantially preventing electrical shorting or the like between closely spaced, adjacent holes. That is, very highly dense concentrations of relatively narrow (in diameter) thru-holes are capable of being provided in these unique dielectric layers which can then be rendered conductive (typically, plated) to provide highly dense circuit connections between designated conductive layers (e.g., signal, power and/or ground) within the final structure incorporating the circuitized substrate. Most significantly, this new dielectric material is of a base material (p-aramid) impregnated with a suitable resin so as to assure reduced flammability for the final substrate in addition to low moisture absorptivity and other advantageous features defined herein. Surprisingly, the material, although including p-aramid fibers from the paper used, overcomes the aforementioned disadvantages associated with woven or non-woven fiberglass reinforcement materials.

It has been discussed above that utilization of fiberglass fibers in substrate constructions is often deleterious during the hole-forming and plating stages because of fiber intrusion within the holes which can form a base for a conductive path to adjacent conductive holes. The dielectric material as taught herein, although containing p-aramid fibers, is substantially able to overcome such disadvantages while assuring a product which is capable of containing high density patterns of thru-holes and thus improved operational capabilities compared to many prior art products. As mentioned, the new dielectric material of the invention possesses low moisture absorption properties which are extremely beneficial because it provides for ease of processing (including during lamination when temperatures may exceed 245 deg. C.) and a highly desirable low dielectric constant (advantageous for the reasons cited above). Layers including this material possess sufficient strength and durability to withstand the rigors, particularly the high temperatures and pressures, associated with lamination as conventionally utilized in the manufacture of PCBs, and in particular producing such PCBs having several dielectric and conductive layers bonded together.

In one embodiment of this invention, the p-aramid material comprises substantially one-hundred percent of the base layer member. Unlike continuous or semi-continuous fiberglass fibers as defined above, p-aramid fibers as used in papers for this invention are very short and randomly oriented in the x-y plane of the material sheet, which enables these fibers to overcome the above problems associated with these longer and larger (in diameter) fiberglass fibers, especially those which are of a continuous nature with an orientation traversing the full width and/or length of the substrate. The resulting dielectric layers will each thus possess the several features cited above which known p-aramid-containing products provide, such as reduced flammability, robustness, etc. In this invention, the p-aramid paper is impregnated with a low moisture absorptivity resin (one example being described in greater detail below), preferably a high Tg (glass transition temperature) thermosetting polymer resin which, in one embodiment, has less than 0.5 percent moisture absorption when the formed dielectric layer is immersed in water for a period of about 24 hours at a temperature of about 22° C. In this one embodiment, the resin of the formed layer comprises from about ten to about eighty percent by weight of the layer. Most importantly, the formed layer does not include or require fiberglass fibers, as mentioned above, for support.

The resin-p-aramid paper dielectric layers may each have a thickness within the range of only from about twenty microns to about 200 microns, thereby illustrating the extreme thinness of the final layers, a highly desirable feature when attempting to meet many of today's demanding miniaturization requirements. Not having fiberglass fibers (strands) as part thereof, the coefficient of thermal expansion (CTE) of the formed dielectric layer may be from about ten to about twenty-five parts per million (ppm) per degree C. in both x and y directions. As will be shown in the drawings, the formed dielectric layers are each capable of having a plurality of thru-holes formed therein, in patterns having relatively high densities of as much as 5,000 to about 10,000 holes per square inch of the dielectric area.

The minimum two dielectric layers used in the multilayered circuitized substrate as taught herein may be produced using the p-aramid and resin materials defined herein, which, in one embodiment, may each possess the following key electrical, thermal, physical and thermal expansion properties, as defined by process development analyses:

| Electrical Properties | |
|---|---|
| Dielectric constant (Dk) at 1-2.5 GHz | 3.45. |
| Loss factor at 1 MHz | 0.008. |
| Thermal Properties | |
| Tg (DSC mid point) (deg. C.) | 215. |
| Tg (TMA) (deg. C.) | 210. |
| Decomposition Temperature (deg. C.) | 340. |
| Thermal Expansion | |
| Below Tg (ppm/deg. C.) | 15. |
| Above Tg (ppm/deg. C.) | 8. |
| Physical Properties | |
| % moisture, after 24 hours | 0.45. |
| % moisture, after 1 hour (pressure cooker conditions - 121 deg. C./ 100% relative humidity) | 0.7. |
| Elongation (%) | 2.7 |

These resulting dielectric layers each possess a low moisture absorptivity (less than about 0.5% moisture absorption after being immersed for 24 hours in water at 22° C. (room temperature)) which renders the resulting substrate highly desirable for building PCBs and chip carriers. Equally important, these layers, when staged as defined, are then readily receptive to subsequent circuitization processing using conventional photolithographic processing. In a preferred embodiment, the desired circuitry is formed of copper and applied using such processing. Photolithographic processing of substrates of this type is well known in the PCB field and further description is not deemed necessary.

The aforementioned highly dense concentrations of thru-hole patterns are attainable using desirable laser drilling without, surprisingly, electrical shorting of the holes after plating of the sidewalls thereof has occurred. That is, the plating material (typically copper) does not migrate from thru-hole to thru-hole, as occasionally occurred when continuous and/or semi-continuous fiberglass materials were utilized. This is especially true when compared to use of continuous fibers. In one embodiment of the invention, it was possible to drill a total of up to about 10,000 holes within one square inch of dielectric layer, representing an example of the high density hole patterns attainable using the unique teachings herein. As stated, a laser is preferably used for such drilling, and in particular, a YAG laser, which may operate at speeds of 20-50 thru-holes per second, each hole having less than a two mil diameter and extending through the dielectric layer. This laser is also capable of providing up to 250 thru-holes per second with the resulting holes having similar diameters but extending only partly into the dielectric layer (also referred to as "blind vias" as mentioned above).

The multilayered circuitized substrates as defined herein may be in the form of a chip carrier or PCB, or other electronic packaging product, such as those made and sold by the Assignee of the instant invention. One particular example is a chip carrier sold under the name HyperBGA (HyperBGA being a registered trademark of the Assignee, Endicott Interconnect Technologies, Inc.). The invention is of course not limited to chip carriers or even to higher level PCBs. It is also understood that more than one such circuitized substrates (e.g., those each also referred to as a "core", a specific example being what is referred to as a "power core" if the core includes one or more power planes and is thus to serve primarily in this capacity) may be incorporated within such a carrier or PCB, depending on operational requirements desired for the final product. As defined below, the "core" can be readily "stacked up" with other layers, including conductors and dielectric layers (including of dielectric materials other than those taught herein), and bonded together (preferably using conventional PCB lamination processing) to form a much thicker, multilayered carrier or multilayered PCB. The laminate so formed is then subjected to further processing, including conventional photolithographic processing to form circuit patterns on the outer conductive layers thereof. As described herein-below, such external patterns may include conductive pads on which conductors such as solder balls can be positioned to connect the structure to other components such as semiconductor chips, PCBs and chip carriers if so desired. The unique teachings of this invention are thus adaptable to a multitude of electronic packaging products. Significantly, the invention enables incorporation of the circuitized substrate (e.g., if a dense "core") with its highly dense thru-hole patterns and interconnection capabilities within a larger multilayered structure in which the other layered portions do not possess such densification and operational capabilities. Thus, a "standard" multilayered product can be produced for most of its structure and the unique subcomponent taught herein simply added in as part of the conventional processing of such a "standard". If the circuitized substrate core is internally positioned, it enables highly dense connections between other, less dense portions of the multilayered product, thus giving said product the unique capabilities of the invention in at least a portion thereof.

FIG. 1 represents a first step in making a p-aramid "base" dielectric layer 11 according to one embodiment of this invention. Layer 11 is formed by first providing a layer 13 of p-aramid paper, preferably comprised of one of the above p-aramid materials but which may be of other p-aramid materials known in the art. The p-aramid material comprises one-hundred percent of the paper in this particular embodiment. In this example, the paper is made primarily from p-aramid fibers of various lengths and diameters and a certain quantity of pulp which is again based on p-aramid composition. Further, it is made in a way that has side fibrids, which are like branches to assist in holding the fibers and pulp together with the fibers randomly oriented in the x-y plane. The paper in this form may be made to a thickness of from a little as about one mil (a mil being one-thousandths of an inch) up to about six mils. In this particular example, the paper has a thickness of 3.6-3.8 mils. Such a paper is available from Hollingsworth & Vose Company, having a business location in East Walpole, Mass.

The layer 13 is now impregnated with a particular low moisture resin 14. The preferred resin material for this use is one with a high glass transition temperature, is halogen-free, and one which possesses a high decomposition temperature. In one embodiment, the resin composition preferably comprises: (1) from about twenty percent to about thirty percent of Mitsubishi 2060B BT resin, (including seventy percent solids in methyl ethyl ketone, and available from Mitsubishi Chemicals, Inc.); (2) from about three percent to about ten percent "Tactix 756" resin (a dicyclopentadiene-containing polyepoxide resin, available from Huntsman Chemical), at one hundred percent solids; (3) from about five percent to about fifteen percent "Exolit OP 930" retardant (a halogen-free flame retardant with a high phosphorus content suitable for use in both thermoplastic and thermoset applications, provided in the form of a white, fine-grained powder, and is available from Clariant Corporation, Pigments and Additives Division); (4) from about five percent to about fifteen percent "PKHS-40" resin, a high molecular weight, reactive thermoplastic resin available from Inchem Corporation in Rock Hill, S.C. at forty percent solids in methyl ethyl ketone; (5) from about 0.001 to about 0.075 percent manganese octoate at six percent solids in mineral spirits; (6) from about fifteen percent to about twenty-five percent methyl ethyl ketone; and (7) from about zero percent to about one percent Dow-Corning Z-6040, an epoxy functionality silane coupling agent available form Dow-Coming, of Midland Minn.). In addition to the above, an inorganic filler, preferably Tatsumori PLV-6 silica filler (available from Tatsumori, having a USA business location at 595 Fifth Avenue, New York, N.Y.), is added, and at a percent of from about twenty-five to thirty-five percent. All percents above are by weight of the complete composition.

In a more particular embodiment of the invention, the composition may comprise a resin composition including about: (1) twenty-five percent of the Mitsubishi 2060B BT resin; (2) 4.5 percent of the "Tactix 756" resin; (3) 8.5 percent of the "Exolit OP 930"; (4) nine percent of the "PKHS-40" resin; (5) 0.03 percent of the manganese octoate; (6) twenty percent of the methyl ethyl ketone; and (7) from about 0.17 percent of the Dow-Corning Z-6040. This composition may in turn include thirty-three percent of the Tatsumori PLV-6 silica filler. As in the above example, all percents are by weight of the complete composition.

It is also possible for layer 13 to be impregnated with a resin containing an inorganic particulate filler and having the specific ranges of the filler-containing composition defined in co-pending application Ser. No. 12/081,042, filed concurrently herewith.

Conventional vertical treating may be used to accomplish impregnation of the paper. In this approach, the p-aramid paper is dipped into a solvent-carried resin solution, and then dried in a vertical air convection or infrared oven. Impregnation occurs until the paper base is saturated with the above first identified embodiment resin composition to approximately sixty-six percent by weight of the final resin-paper member 11. In one version of this particular embodiment, the resin may form about fifty to about sixty-seven percent by weight of the final resin-paper member.

Layer 11, comprised of the paper and resin (and filler) composition, is now subjected to heat at a temperature of from about 120 to degrees Celsius (C.) to about 150 degrees C., sufficient to drive off (remove) any unwanted solvents and/or significantly, to advance the 'stage' of the resin. In one embodiment, the resin now is at a "B-stage" cure, meaning it is not yet fully cured but workable in sheet form so that it may be aligned and stacked with other layers such as is needed in lamination processing. Heat is preferably applied by placing layer 11 in a convection oven for a period of from about two to five minutes. It is possible to heat layer 11 other ways, including, e.g., infrared radiation. As mentioned, the heat level should be sufficient to drive off undesirable solvents and also to increase the resin cure stage, but not to fully cure the resin. The defined temperature range and time period is not limiting of the invention, as these are dependent on resin material saturation, layer 11 thickness, catalyst levels and other possible factors. The layer is now allowed to cool, e.g., by subjecting it to room temperature for a period of from about one minute to about two minutes. It is then ready for further processing, including cutting into desired lengths and widths, depending on the respective substrate dimensions into which the layer is being incorporated. In one example, layer 11 is of a rectangular sheet-like configuration having length and width dimensions of fifty-one centimeters and sixty-six centimeters, respectively.

Dielectric layer 11, in one embodiment of this invention, is a thin layer adapted for being aligned with and bonded to at least one additional dielectric layer of similar composition, following formation of at least one circuit layer thereon (see below). In singular form, with at least one such conductive circuit layer thereon, the structure may be referred to as a thin core substrate. When combined with a second dielectric layer of similar composition, the resulting multilayered circuitized substrate will be relatively thin and yet rigid (strong) enough to provide sufficient support for additional dielectric layers (even of different compositions) if a much thicker final circuitized substrate is desired. This represents a significant feature of the invention because it enables very thin dielectric layers to be used, in combination with one or more conductive circuit layers, while assuring the other highly desirable features cited above. By the term "thin" as used to define the thickness of each of these two dielectric layers is meant a thickness of no greater than 250 microns. Layers as thin as only about twenty microns may be successfully produced using the teachings of this invention and utilized within larger substrate products. Such "thinness" represents a significant feature of the invention for, among others, the reasons stated hereinabove.

Figure 2:
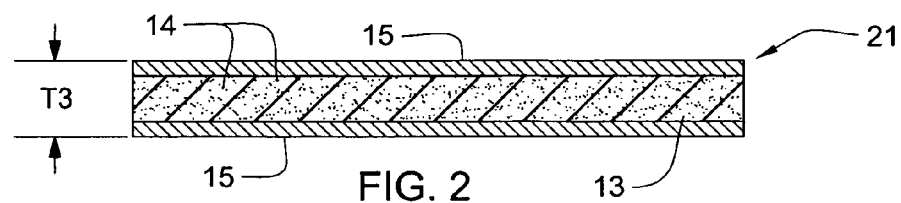

As shown in FIG. 2, outer conductive layers 15 are next applied to the now-cooled interim paper-composition layer 11 using conventional PCB lamination processing. In one example, each layer 15 is comprised of copper or copper alloy and may each have a thickness as little as from about three to about eighteen microns. When aligned on opposite sides of layer 11, a total pressure of about 400 pounds per square inch (psi) may be used, at a temperature of about 188 deg. C., for a period of about 90 minutes. The result is a laminated structure 21 having outer conductive layers 15 each of substantially the same thickness as above but a common interim dielectric layer now having a compressed thickness of, in one example, only about 134 microns, giving the overall final thin core circuitized substrate thickness (T3) of no greater than 250 microns. By the term "thin" as used to define the invention's thin core substrate (at a minimum, including one dielectric layer (i.e., 11) and one conductive layer (i.e., 15)) is meant a thickness of no greater than about 270 microns (e.g., the maximum thickness of layer 11 at 250 microns and the maximum thickness of a single conductive layer 15 at 18 microns). In the case of the thin core substrate shown in FIG. 2, where two outer conductive layers 15 are used, is thus meant a thickness no greater than about 290 microns (the 270 dimension defined above plus the maximum added conductive layer thickness of about eighteen microns). The FIG. 2 thin core substrate structure, with the interim dielectric layer and two outer conductive layers, now serves as the first part of the multilayered circuitized substrate defined herein. That is, it will serve as a thin core substrate for a thicker, multilayered product such as a PCB or chip carrier.

Figure 3:
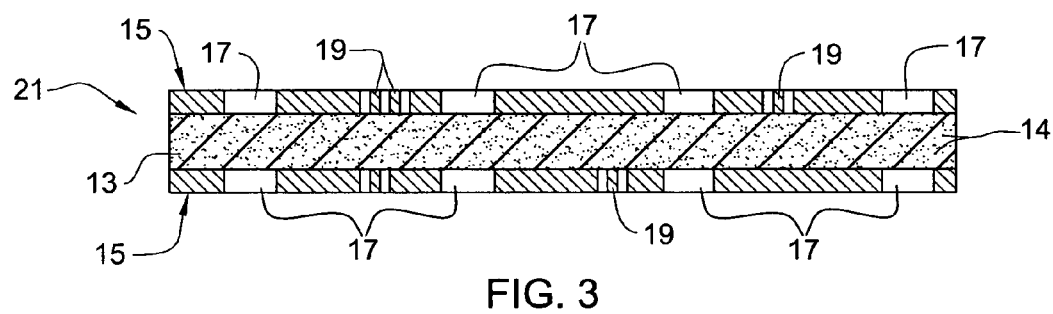

Structure 21 (now shown in FIG. 3 on a larger scale than in FIGS. 1 and 2 for enhanced illustration purposes) is now subjected to conventional photolithographic processing in which outer conductive layers 15 are "circuitized." That is, layers 15 are processed using known processing to form a desired pattern thereon. This pattern will include, at a minimum, several openings 17 in each layer which are aligned opposite each other as shown. In addition, it is also within the scope of the invention to provide additional circuit features such a lines and/or pads 19 within one or both layers. If structure 21 is to eventually serve as part of a "power core", layers 15 will typically only include openings 19 therein or, may not include any openings but instead be in solid form. However, if one or both layers 15 are to function in another capacity, e.g., as a signal layer, then patterns are provided. The patterns in FIG. 3 (and FIGS. 4-6) are thus not meant to limit the scope of the invention.

Figure 4:
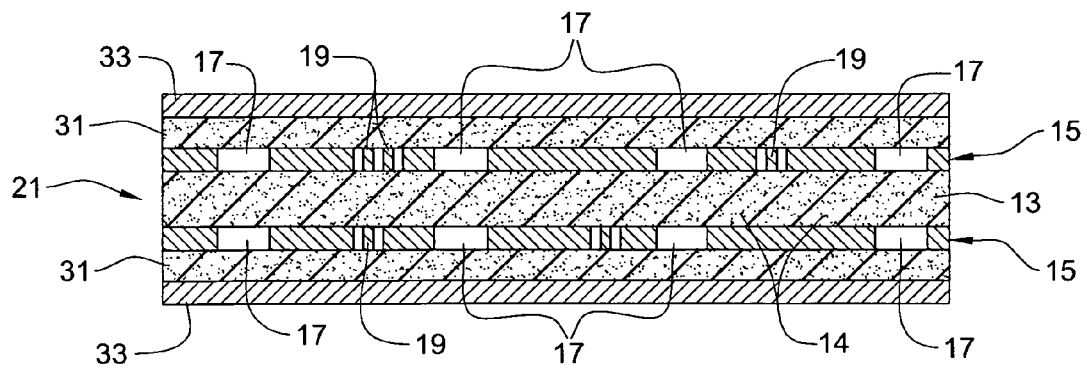

In order to form a multilayered circuitized substrate in accordance with the unique teachings herein, structure 21 will now include at least one (as shown in FIG. 4, two) additional layers 31 of dielectric material having substantially the same composition (including filler) as layer 11) on both opposite sides of the structure. As such, each layer will have no continuous or semi-continuous fiberglass fibers as part thereof. These layers 31, of similar material as layer 11, will thus possess the highly desirable low moisture absorption and low thermal expansion properties desired for products such as PCBs and chip carriers. In the form shown in FIG. 4, structure 21 thus represents one embodiment of a multilayered circuitized substrate taught herein.

Figure 5:
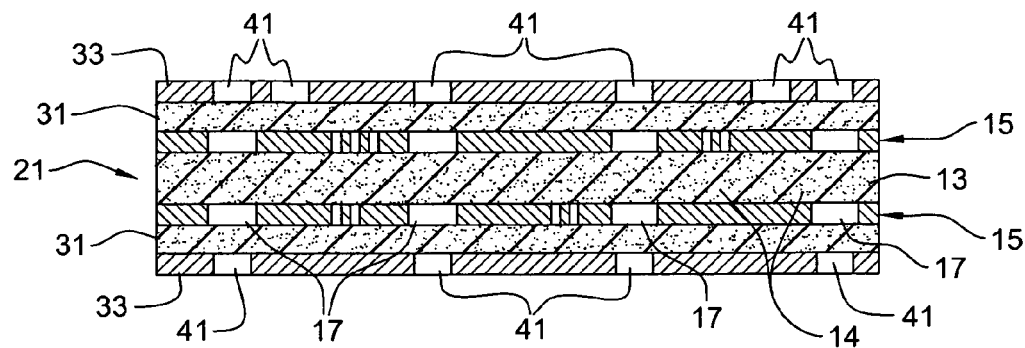
Figure 6:
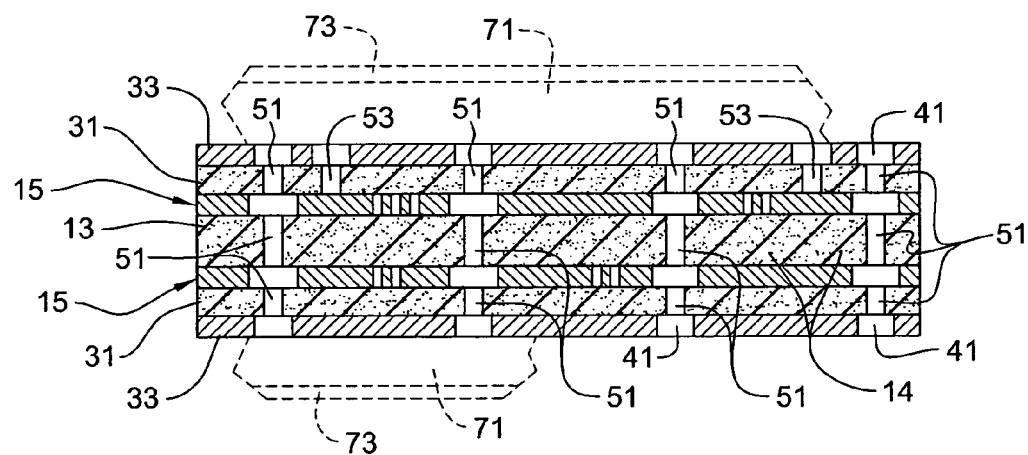

Each of the illustrated dielectric layers 31 preferably includes a thin conductive (e.g., copper) layer 33 thereon. In one example of the invention, layers 31 and 33 are each comprised of the same thicknesses as layers 13 and 15 in FIG. 2 and are laminated onto structure 21 using lamination processes known in the art, including one using the same parameters defined above for structure 21. Following lamination, each of the conductive layers 33 may be "personalized" to include a plurality of openings 41 therein which align with respective ones of the openings 17 in the conductive layers 15 located adjacent thereto (but separated by the interim layer 31), as seen in FIG. 5. It is noteworthy that at least one opening 41 is aligned with a corresponding opening 17, but that other, perhaps smaller openings 41 may also be provided which are not so aligned, but instead align with other portions of the circuit formed on layer 15 (if one has been so formed). With openings 41 formed, thru-holes 51 are now laser drilled within the FIG. 5 structure using a YAG laser as defined above. The laser drills thru-holes through the entire thickness of the FIG. 5 structure wherever paired, aligned openings 17 and corresponding aligned openings 41 are present, as seen in FIG. 6. In one embodiment, a total of as many as 10,000 holes, each having a diameter of only about two mils, may be provided in each square inch of the structure in these aligned orientations. This represents, again, the highly dense patterns attainable using the teachings of this invention.

In addition to the highly dense pattern of thru-holes 51 which extend through the entire thickness of the FIG. 5 structure, as seen in FIG. 6, lesser depth thru-holes 53 (also referred to by some in the art as "blind vias") may also be formed simultaneously with the formation of holes 51 to reach only a conductive layer 15. The purpose of these latter holes is to eventually form an electrical connection between conductive layer 33 and layer 15 (e.g., from selected signal lines on one to lines on another, again assuming layer 15 is to function as a signal carrying conductive plane), adding greater versatility to the invention if so used. One or both layers 15 could also serve as a ground layer and thus provide grounding or power distribution functions, if so desired. It is understood that thru-holes 51 and 53 (if used) are then to be plated with conductive material, a preferred material being copper having a thickness of only about 0.2 mils to about one mil. The preferred plating processes for these and the other thru-holes described herein may be either electrolytic or electro-less plating. Electrolytic and electro-less plating of thru-holes is well known in the art so further description is not deemed necessary.

The multilayered circuitized structure shown in FIG. 6 may serve as a stand alone substrate, e.g., a chip carrier, or, as another "core" structure to be used in combination with other conductive and dielectric layers, including with other similar circuitized substrates, in a larger, multilayered structure. In FIG. 6, there is shown the addition of such another dielectric layer 71 (in phantom) on each of the opposite sides of the structure formed with thru-holes therein, and an additional conductive layer 73 (also in phantom) on each of these added dielectric layers. This drawing FIG. is intended to represent the fact that several additional dielectric and conductive layers may be added to the FIG. 6 structure to form a thicker multilayered final product such as a PCB or laminate chip carrier having more than the number of layers shown in FIGS. 3-6. It is also within the scope of the invention to utilize all of the FIG. 4 structures only, to form a multilayered composite, utilizing known "sticker sheet" dielectric layers between each aligned pair during lamination thereof into the final structure. Whichever the choice, the thru-holes in each of the dielectric-conductive structures such as that shown in FIG. 4 will be interconnected electrically, thereby providing conductive paths through selected portions of the final structure, including through the entire structure itself, if desired. If, for example, three FIG. 4 structures are combined to form a multilayered final structure (e.g., a multilayered PCB), then it is clear that the thru-holes of the interim structure will provide electrical interconnection, once rendered conductive such as by the afore-defined plating operation, between the thru-holes of the two outer structures composites. The multilayered circuitized substrate of the invention such as that shown in FIG. 4 may thus serve as an "interconnector" between various circuitized substrate products.

Figure 7:
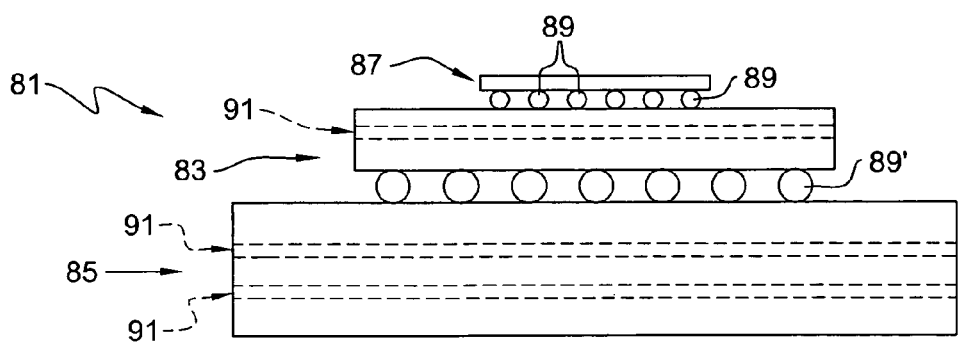
FIG. 7, on a much smaller scale than FIGS. 1-6, illustrates an electrical assembly which may utilize one or more of the multilayered circuitized substrates defined herein and made in accordance with the teachings herein.
Figure 8:
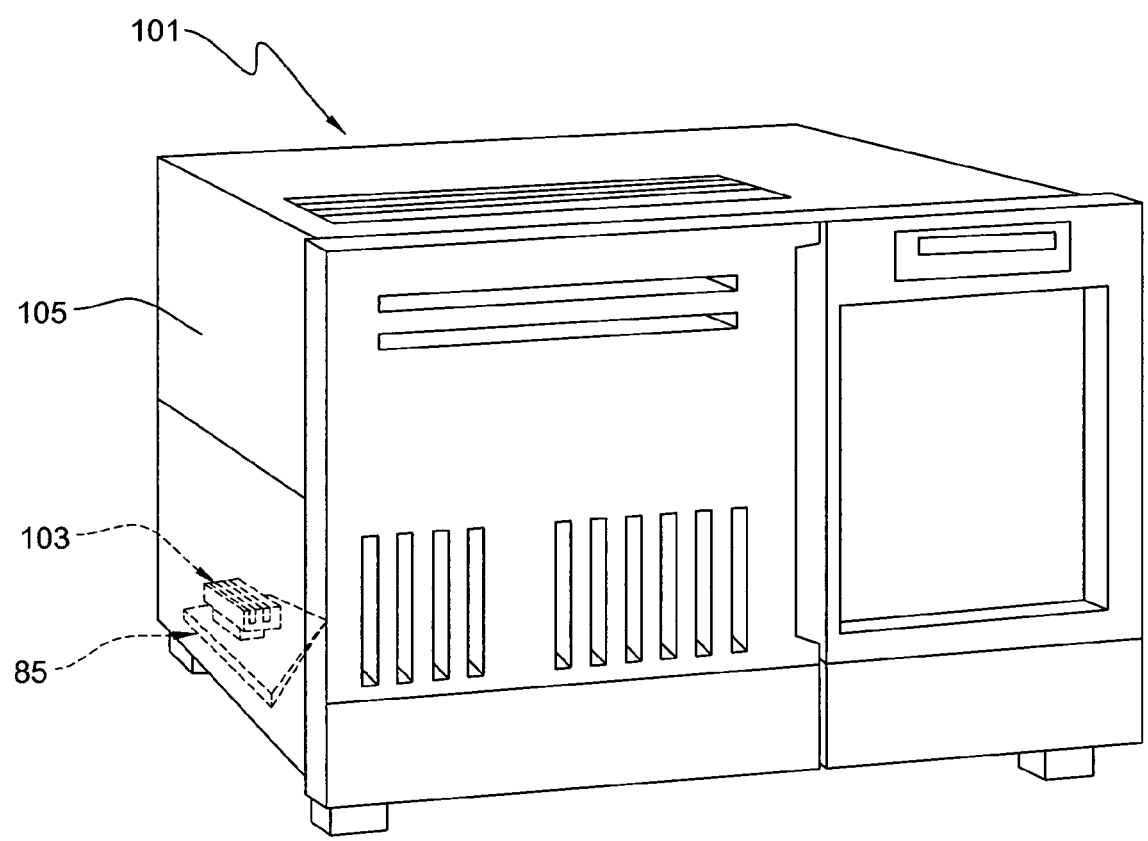
FIG. 8 represents an information handling system according to one aspect of the invention which is capable of utilizing one or more of the multilayered circuitized substrates taught herein.

FIG. 7 represents one example of an electrical assembly 81 that may be formed using the circuitized substrates taught herein. As stated, each multilayered circuitized substrate as formed in accordance with the teachings herein may be utilized within a larger substrate such as a PCB, chip carrier or the like. FIG. 7 illustrates two of these larger structures, one being a chip carrier 83 and the other a PCB 85. PCB 85 is positioned within and electrically coupled to an electronic assembly such as an information handling system as shown in FIG. 8, which may be in the form of a personal computer, mainframe, computer server, etc. Chip carrier 83, as shown, is typically positioned on and electrically coupled to an underlying substrate such as PCB 85. Such a carrier also typically has a semiconductor chip 87 mounted thereon and also electrically coupled to the carrier. In the embodiment of FIG. 7, the connections between chip and carrier and between carrier and PCB are accomplished using solder balls 89 and 89', respectively. Such connections are known in the art and further description is not considered necessary. The significance of FIG. 7 is to show the use of one or more of the circuitized substrates 91 (in phantom) of the invention in the chip carrier 83 and PCB 85, thus forming part thereof. Two substrates 91 are shown as used within PCB 85, while only one is shown within carrier 83. As mentioned above, the invention is not limited to the numbers shown.

In FIG. 8, there is shown an information handling system 101 in accordance with one embodiment of the invention. System 101 may comprise a personal computer, mainframe computer, computer server, or the like, several types of which are well known in the art. System 101, as taught herein, may include the electrical assemblies as shown in FIG. 7, including both PCB 85 and carrier 83, these being represented by the numeral 103 in FIG. 8. This completed assembly, shown hidden, may be mounted on still a larger PCB or other substrate (not shown), one example being a "motherboard" of much larger size, should such a board be required. These components are shown hidden because these are enclosed within and thus behind a suitable housing 105 designed to accommodate the various electrical and other components which form part of system 101. PCB 85 may instead comprise such a "motherboard" in system 101 and thus include additional electrical assemblies, including additional printed circuit "cards" mounted thereon, such additional "cards" in turn also possibly including additional electronic components as part thereof. It is thus seen and understood that the electrical assemblies made in accordance with the unique teachings herein may be utilized in several various structures as part of a much larger system, such as information handling system 101. Further description is not believed necessary.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A multilayered circuitized substrate comprising:
a core substrate having a thickness between 20 and 200 microns including a first dielectric layer being no greater than 0.1524 mm, having a p-aramid paper impregnated with a composition including halogen-free, low moisture absorptivity resin including an inorganic particulate filler and not including continuous or semi-continuous fiberglass fibers as part thereof and a first circuitized layer directly positioned on said first thin dielectric layer; and
a second dielectric layer being no greater than 0.1524 mm, bonded to said thin core substrate to form a multilayered circuitized substrate, said second thin dielectric layer being of a composition similar to said composition of said first thin dielectric layer of said thin core substrate, said second dielectric layer not including continuous or semi-continuous fiberglass fibers.

2. The multilayered circuitized substrate of claim 1 wherein said thin core substrate has a thickness of about 270 microns or less.

3. The multilayered circuitized substrate of claim 1 wherein said low moisture absorptivity resin of said first and second thin dielectric layers comprises a high Tg polymer.

4. The multilayered circuitized substrate of claim 3 wherein said low moisture absorptivity resin of said first and second thin dielectric layers has less than about 0.5 percent moisture absorption when immersed in water for a period of about 24 hours at a temperature of about 22° C.

5. The multilayered circuitized substrate of claim 1 wherein said first and second thin dielectric layers each have a coefficient of thermal expansion in the x and y direction less than about 23 parts per million/degree C.

6. The multilayered circuitized substrate of claim 1 wherein said first and second thin dielectric layers each include a plurality of thru-holes therein, said thru-holes being in a pattern having a density of from about 5,000 thru-holes per square inch to about 10,000 thru-holes per square inch.

7. The multilayered circuitized substrate of claim 1 wherein said first circuitized layer is comprised of copper.

8. The multilayered circuitized substrate of claim 1 wherein said thin core substrate further includes a second circuitized layer positioned on said first thin dielectric layer on a side opposite said first circuitized layer.

9. The invention of claim 8 wherein said multilayered circuitized substrate further includes third and fourth thin dielectric layers, said third and fourth thin dielectric layers each being of a composition similar to said composition of said first thin dielectric layer of said thin core substrate.

10. The invention of claim 9 wherein said multilayered circuitized substrate comprises a chip carrier.

11. The multilayered circuitized substrate of claim 1 further including at least one electrical component positioned on and electrically coupled to said multilayered circuitized substrate, said multilayered circuitized substrate and said component forming an electrical assembly.

12. The multilayered circuitized substrate of claim 11 wherein said electrical component comprises a semiconductor chip.

13. The multilayered circuitized substrate of claim 11 wherein said electrical component comprises a chip carrier.

* * * * *